(12) United States Patent
Landry et al.

(10) Patent No.: US 7,855,445 B2
(45) Date of Patent: Dec. 21, 2010

(54) CIRCUIT DEVICE INCLUDING ROTATED STACKED DIE

(75) Inventors: D. Matthew Landry, Austin, TX (US); Richard Webb, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 359 days.

(21) Appl. No.: 12/111,341

(22) Filed: Apr. 29, 2008

(65) Prior Publication Data
US 2009/0267224 A1 Oct. 29, 2009

(51) Int. Cl.
*H01L 23/02* (2006.01)
(52) U.S. Cl. .................. 257/686; 257/777; 438/107
(58) Field of Classification Search .............. 257/686, 257/777, 723, 724, 784; 438/107, 109
See application file for complete search history.

(56) References Cited

U.S. PATENT DOCUMENTS

| | | | |
|---|---|---|---|
| 5,963,794 A | 10/1999 | Fogal et al. ............... 438/108 |
| 6,133,637 A * | 10/2000 | Hikita et al. ............... 257/777 |
| 6,376,914 B2 * | 4/2002 | Kovats et al. ............. 257/777 |
| 6,462,422 B2 * | 10/2002 | Huang ....................... 257/777 |
| 6,531,782 B1 | 3/2003 | Jones et al. ................ 257/773 |
| 6,563,205 B1 * | 5/2003 | Fogal et al. ............... 257/686 |
| 6,650,008 B2 * | 11/2003 | Tsai et al. .................. 257/686 |
| 6,884,567 B2 | 4/2005 | Sezi ....................... 430/283.1 |
| 6,930,378 B1 | 8/2005 | St. Amand et al. ........ 257/686 |
| 7,061,105 B2 | 6/2006 | Masuda et al. ............ 257/723 |
| 7,071,568 B1 | 7/2006 | St. Amand et al. ........ 257/777 |
| 7,132,753 B1 | 11/2006 | St. Amand et al. ........ 257/777 |
| 7,262,506 B2 | 8/2007 | Mess et al. ................ 257/777 |
| 7,375,419 B2 * | 5/2008 | Mess et al. ................ 257/686 |

* cited by examiner

*Primary Examiner*—S. V Clark
(74) *Attorney, Agent, or Firm*—Polansky & Associates, P.L.L.C.; R. Michael Reed

(57) ABSTRACT

In a particular embodiment, a circuit device includes a first die coupled to a circuit substrate and having a substantially planar surface. The first die includes electrical contacts distributed on the substantially planar surface adjacent to at least three edges of the first die. The circuit device further includes a second die attached to the substantially planar surface of the first die. The second die is rotated by an offset angle about an axis relative to the first die. The offset angle is selected to allow horizontal and vertical access to the electrical contacts.

20 Claims, 9 Drawing Sheets

CIRCUIT DEVICE INCLUDING ROTATED STACKED DIE

FIELD OF THE DISCLOSURE

The present disclosure is generally related to a circuit device including a rotated stacked die. More particularly, the present disclosure relates to a multi-chip circuit package including multiple stacked die where at least one of the die is rotated by an offset angle.

BACKGROUND

In general, as technology advances, electronic devices become smaller and smaller. At the same time, integrated circuit devices have become increasingly complex and are used in increasing density on integrated circuits within such electronic devices. In some instances, when two circuits are connected, they can be placed side-by-side on a substrate. However, the resulting substrate consumes a significant area. To reduce overall area of a circuit substrate, integrated circuit die are sometimes stacked on top of one another and bonded together by an adhesive to create a multi-chip package.

With stacked die, manufacturing tolerances and fabrication requirements dictate that a second die is placed onto a first die, allowing clearance for bond wires to be connected to bond pads of the first die. Conventionally, such clearance is provided by using a second die that is significantly smaller than the first die, by offsetting the second die relative to a center axis of the first die, by using a mounting structure to elevate the second die relative to the first die, or by rotating the first die by plus or minus 90 or 180 degrees to avoid covering electrical contact structures of the first die.

Unfortunately, conventional techniques typically result in accessibility to the electrical contact structures in a first dimension (such as a vertical dimension), but access from a second dimension (such as a horizontal dimension) may be obscured. Accordingly, establishing bond wire connections that satisfy spacing and clearance requirements in stacked multi-chip configurations can be difficult.

SUMMARY

In a particular embodiment, a circuit device includes a first die coupled to a circuit substrate and having a substantially planar surface. The first die includes electrical contacts distributed on the substantially planar surface adjacent to at least three edges of the first die. The circuit device further includes a second die attached to the substantially planar surface of the first die. The second die is rotated by an offset angle about an axis relative to the first die. The offset angle is selected to allow horizontal and vertical access to the electrical contacts.

In another particular embodiment, a circuit device includes a first die coupled to a circuit substrate and having a substantially planar surface. The first die includes electrical contacts distributed on the substantially planar surface. The circuit device further includes a second die attached to the substantially planar surface of the first die. The second die is rotated about an axis relative to the first die by an offset angle to allow access to the first electrical contacts. The offset angle is a non-integer multiple of $\pi/2$ radians.

In still another particular embodiment, a method of forming a multi-chip circuit package is disclosed that includes attaching a first planar surface of a first die to a circuit substrate. The first die includes a second surface that is substantially planar and that extends substantially parallel to the first planar surface. The second surface includes a plurality of electrical contacts distributed adjacent to at least three edges of the first die. The method further includes determining an offset angle about an axis orthogonal to the first die for rotation of a second die about the axis to allow mechanical access to the plurality of electrical contacts. The method also includes attaching the second die to the second surface of the first die. The second die is rotated relative to the first die by the determined offset angle.

DETAILED DESCRIPTION OF ILLUSTRATIVE EMBODIMENTS

Figure 1:
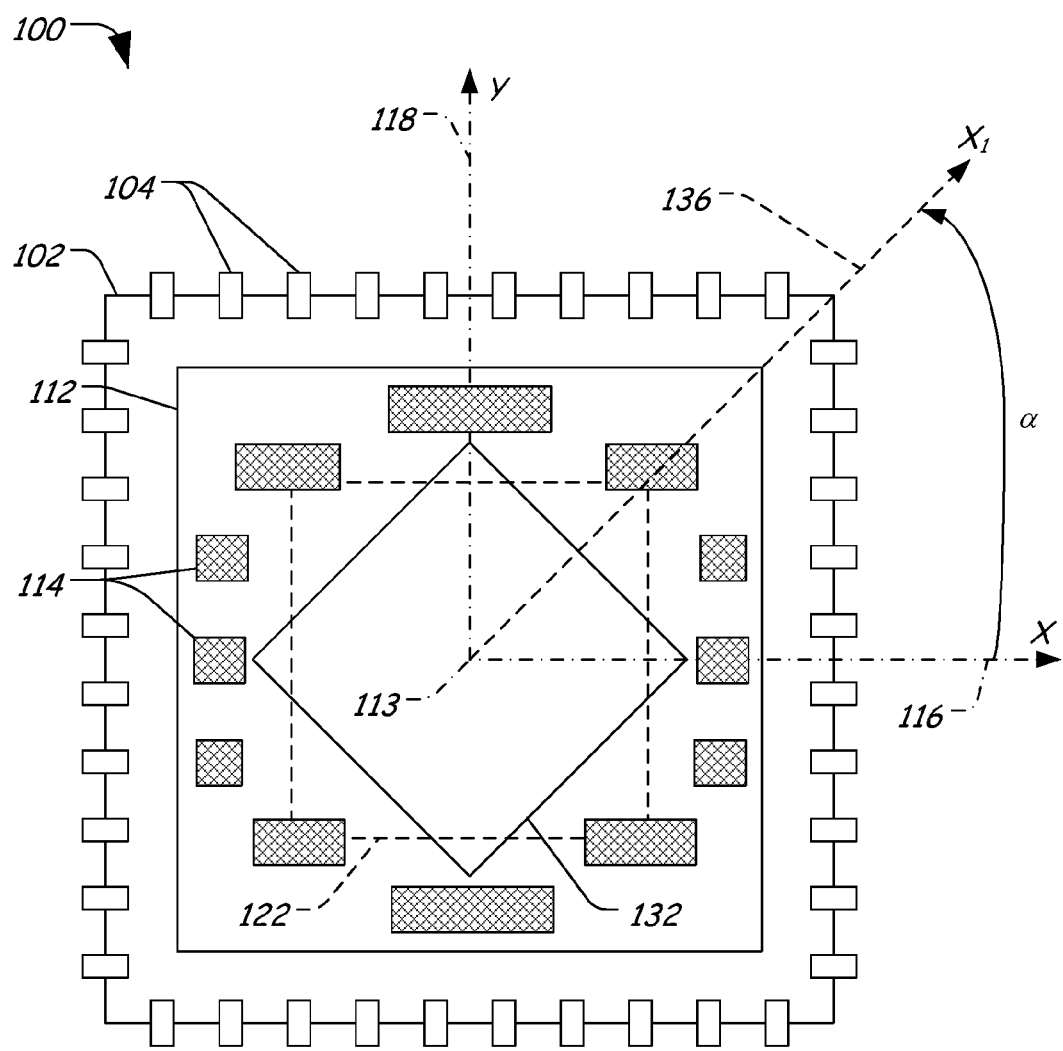
FIG. 1 is a diagram of a particular illustrative embodiment of a multi-chip circuit package including a first die and including a second die attached to the first die and rotated by an offset angle relative to the first die.

FIG. 1 is a diagram of a particular illustrative embodiment of a multi-chip circuit package 100 including a first die 112 and including a second die 132 that is attached to the first die 112 and rotated by an offset angle ($\alpha$) relative to the first die 112. In a particular embodiment, the first die 112 is physically larger than the second die 132. The multi-chip circuit package 100 further includes a substrate 102 including a plurality of leads 104. The first die 112 is fixed to the substrate 102 via an adhesive. In a particular example, the adhesive may be electrically insulating. The first die 112 includes a plurality of bond pads 114, which may be electrically coupled to the plurality of leads 104 via bond wires. Further, the first die 112 includes a center axis 113 that is orthogonal to an x-y plane associated with a substantially planar surface of the first die 112. The x-y plane is generally indicated by the x-axis 116 and the y-axis 118, which extend from the center axis 113.

The second die 132 is rotated relative to the first die 112 about the center axis 113 by the offset angle ($\alpha$). In a particular example, relative to first position 122, the second die 132 is rotated such that the x-axis 116 is shifted by the offset angle (α) to provide a second x-axis (X₁) 136 and a corresponding y-axis (not shown). By rotating the second die 132 relative to the first die 112, the second die 132 can be oriented and positioned to be placed within an exclusion area of the first die 112, allowing the second die 132 to be fixed to the first die 112 without obscuring a bond pad (such as the bond pad 114) associated with the first die 114. In general, the exclusion area refers to a theoretical boundary that defines a safe area in which a die may be placed without obscuring a bond pad. When a die extends past the exclusion area, the die may obscure a bond pad in a horizontal or vertical direction.

In general, while the offset angle (α) illustrated in FIG. 1 is approximately a 45 degree angle (i.e., π/4 radians), it should be understood that other offset angles may also be used to orient and position the second die 132 such that the second die 132 does not extend past a boundary of the exclusion area of the first die 112. In a particular example, the offset angle (α) is defined by the following equation:

$$\alpha = n * \frac{\pi}{2} \quad \text{(Equation 1)}$$

where n represents a real, non-integer (i.e., a real fractional or irrational) value. In this particular example, the offset angle (α) is an angle other than 0, 90, 180, 270, or 360 degrees.

In a particular embodiment, the first die 112 includes a plurality of bond pads 114 that extend about the periphery of the first die 112 along at least three sides (edges). In FIG. 1, all four edges of the first die 112 include bond pads, such that the exclusion area of the first die 112 is circumscribed on all sides by at least one bond pad of the plurality of bond pads 114.

Figure 2:
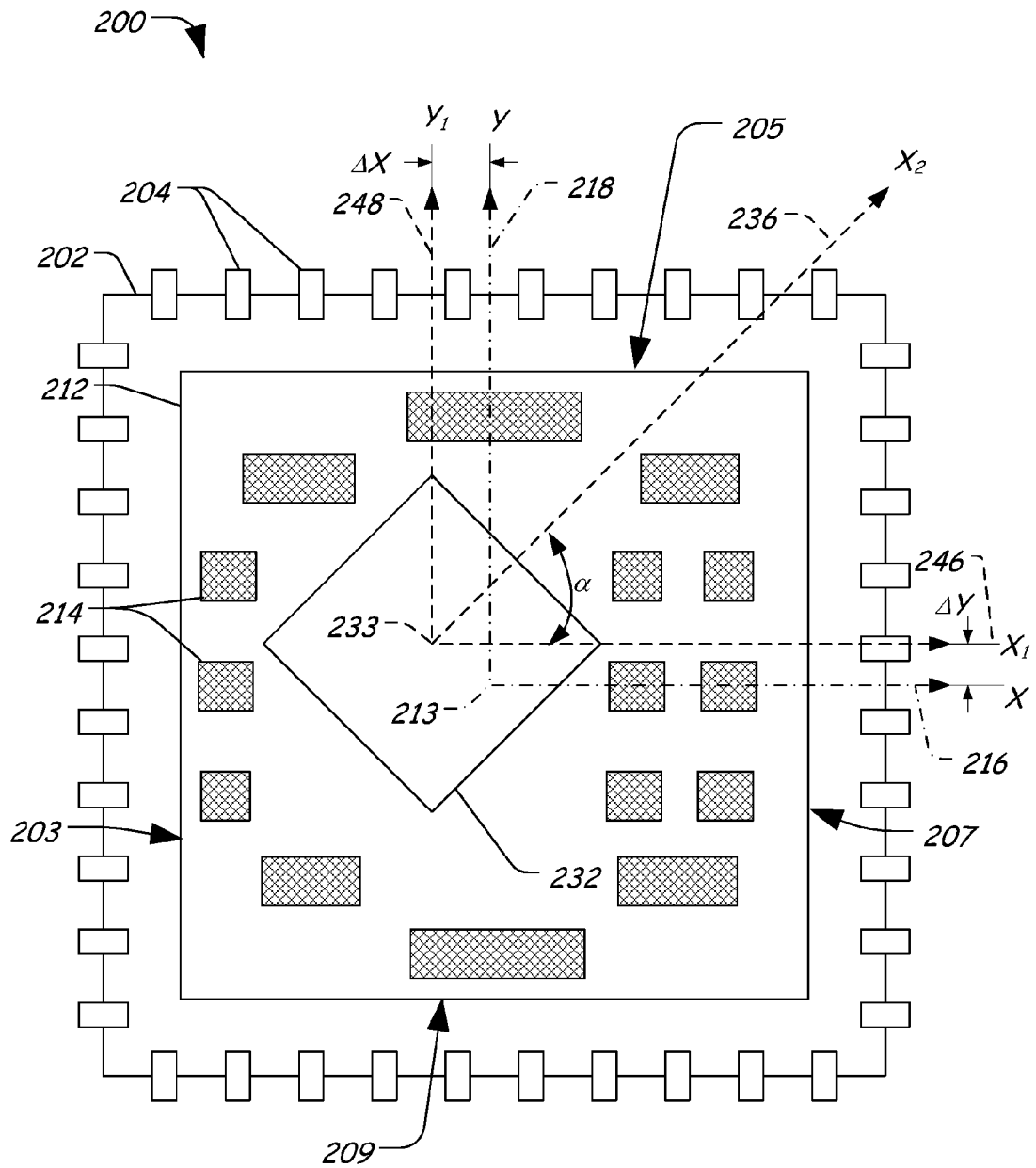
FIG. 2 is a diagram of a second particular illustrative embodiment of a multi-chip circuit package including a first die and including a second die attached to the first die and rotated by an offset angle and offset in x and y directions relative to the first die.

FIG. 2 is a diagram of a second particular illustrative embodiment of a multi-chip circuit package 200 including a first die 212 and including a second die 232 that is attached to the first die 212, rotated by an offset angle (α), and offset in x and y directions relative to the first die 212. The multi-chip circuit package 200 includes a substrate 202 having a plurality of leads 204. The first die 212 is fixed to the substrate 202 by an electrically insulating adhesive. The first die 212 includes a plurality of bond pads 214 positioned about the periphery of the first die 212. The first die 212 also includes a central axis 213 and includes a substantially planar surface that extends within an x-y plane indicated by the x-axis 216 and the y-axis 218.

The second die 232 includes a second center axis 233 that is translated (offset) within the x-y plane in an x-direction by a negative translational x-axis offset (-ΔX) and in a y-direction by a positive translational y-axis offset (ΔY) relative to the center axis 213 to form a new x-y axis extending from the second center axis 233. The new x-y axis includes a new x-axis (X₁) 246 and a new y-axis (Y₁) 248. Further, the second die 232 is rotated relative to the new x-y axis by an offset angle (α), as indicated by the line (X₂) 236.

In general, by rotating the second die 232 by an off-set angle (α) relative to the first die 212 and by shifting the second die 232 by translational offsets in both the x and y directions (i.e., -ΔX and ΔY, respectively), the second die 232 can be fixed directly to the first die 212 without obscuring the plurality of bond pads 214. In general, the translational offsets may be in a positive or negative x and y directions. Further, off the shelf circuit components may be stacked using this technique by rotating and shifting the second die 232 relative to the first die 212. Further, a third die may be stacked onto the second die 232, where the third die is shifted in an x-direction relative to the second center axis 233 of the second die 232, shifted in a y-direction relative to the second center axis 233 of the second die 232, rotated relative to the second die 232, or any combination thereof, to avoid obscuring a bond pad associated with the second die 232.

In a particular embodiment, the plurality of bond pads (electrical contacts) 214 are distributed on the substantially planar surface of the first die 212 adjacent to at least three edges 203, 205, 207, and 209 of the first die 212. In a particular example, the second die 232 includes a second plurality of leads (electrically conductive leads), such as the third and fourth bond pads 334 and 338 illustrated in FIG. 3. In another particular example, the offset angle (α) is an angle of 45 degrees, 135 degrees, 225 degrees, or 315 degrees. In still another particular example, the offset angle (α) may be an angle that is a non-integer multiple of 90 degrees (i.e., a non-integer multiple of π/2 radians).

Figure 3:
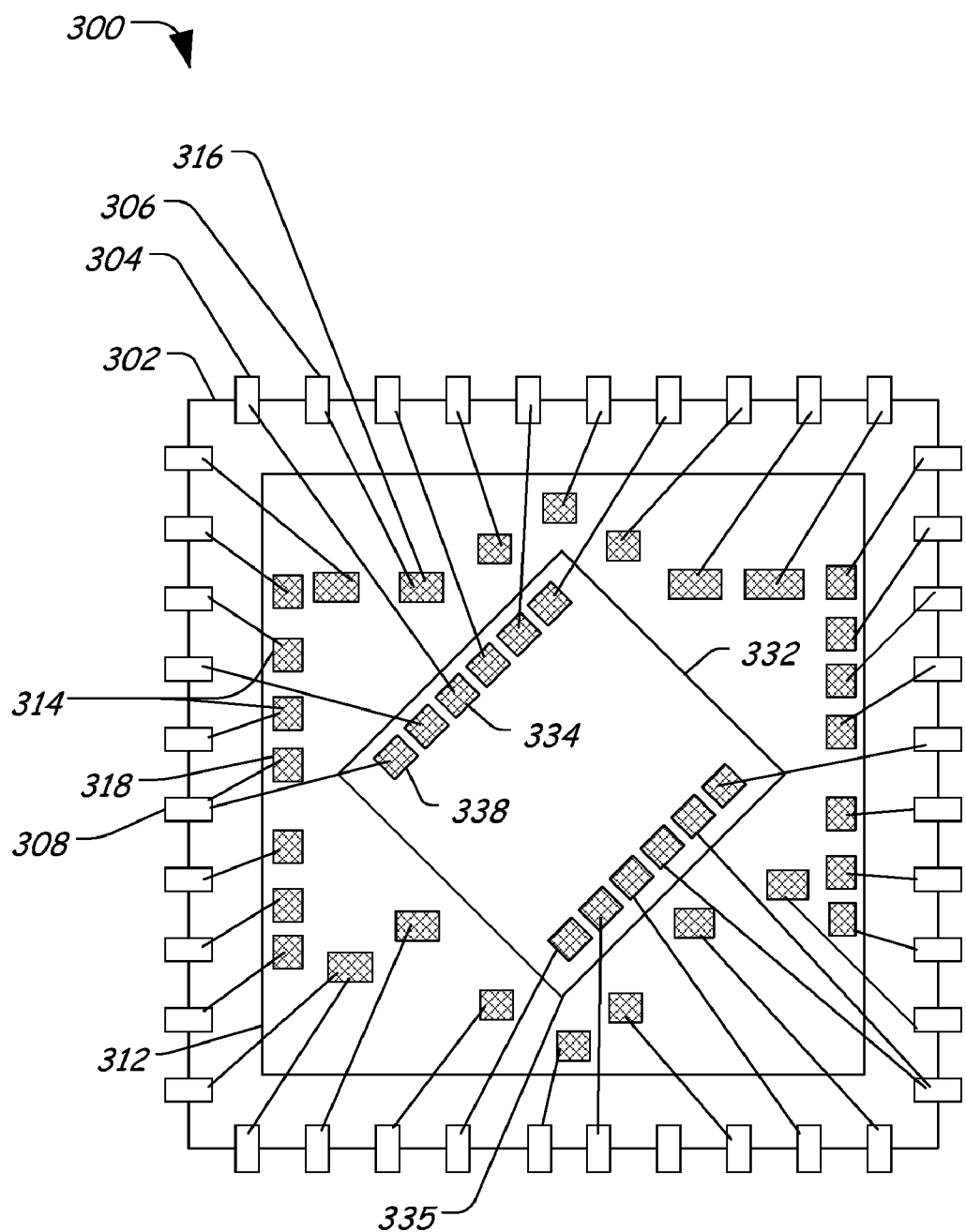
FIG. 3 is a diagram of a third particular illustrative embodiment of a multi-chip circuit package including a first die and a second die attached to the first die and rotated by an offset angle relative to the first die.

FIG. 3 is a diagram of a third particular illustrative embodiment of a multi-chip circuit package 300 including a first die 312 and a second die 332 that is attached to the first die 312 and rotated by an offset angle relative to the first die 312. The multi-chip circuit package 300 includes a substrate 302 having a first lead 304, a second lead 306, and a third lead 308. The first die 312 includes a plurality of bond pads 314, including a bond pad 316 and a second bond pad 318. The second die 332 includes a third bond pad 334 and a fourth bond pad 338. A corner of the second die 332 is generally indicated at 335.

In a particular embodiment, the first die 312 is electrically coupled to the substrate 302 via a first bond wire extending from first bond pad 316 to the second lead 306. The second die 332 is electrically coupled to the substrate 302 via a third bond wire extending from the third bond pad 334 to the first lead 304. Further, the first die 312 and the second die 332 are electrically coupled through the substrate 302 via a second bond wire extending from the second bond pad 318 to the third lead 308 and from the fourth bond pad 338 to the third lead 308.

In a particular illustrative embodiment, bond wires interconnecting the second die 332 with the substrate 302 can be interleaved with bond wires that interconnect the first die 312 with the substrate 302. Further, by rotating the second die 332 relative to the first die 312, horizontal and vertical access to the plurality of bond pads 314 of the first die 312 and of the second die 332 can be enhanced, making it easier to form the electrical attachments. Further, fabrication rules that prohibit overlap of bond wires can be satisfied without having to alter the selected circuit components. Instead, the particular offset angle and the particular x and y offsets can be selected to provide vertical and horizontal access to the plurality of bond pads 314 and to allow for interleaved interconnections that satisfy device fabrication rules.

Figure 4:
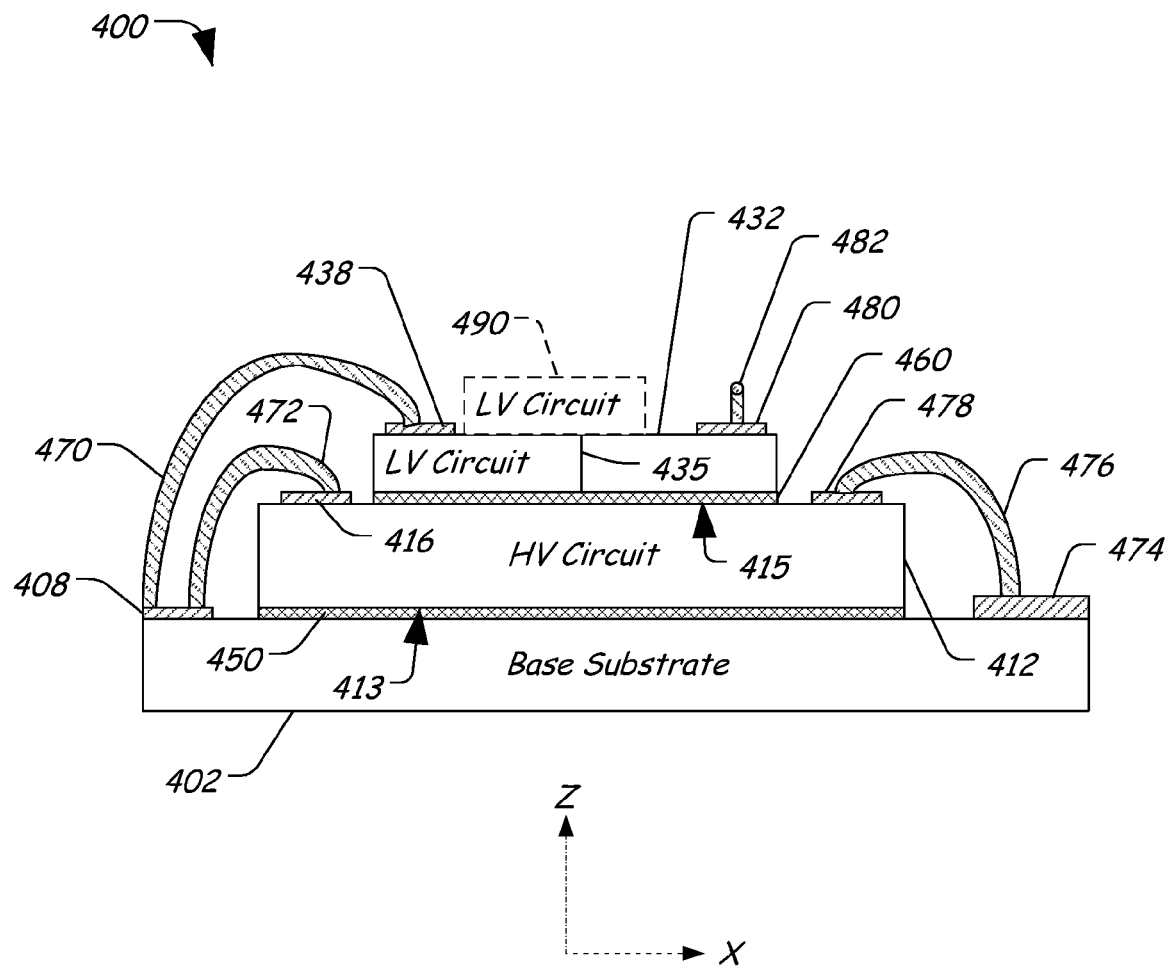
FIG. 4 is a block diagram of a particular illustrative embodiment of a multi-chip circuit package including a first die and a second die attached to the first die and rotated by an offset angle relative to the first die.

FIG. 4 is a block diagram of a particular illustrative embodiment of a multi-chip circuit package 400 including a first die 412 and a second die 432 that is attached to the first die 412 and rotated by an offset angle relative to the first die 412. The multi-chip circuit package 400 includes a substrate 402 that includes a plurality of leads, such as a first lead 408 and a second lead 474. The substrate 402 is fixed to a first planar surface 413 of the first die 412 via a first adhesive layer 450. In a particular embodiment, the first adhesive layer 450 can be electrically insulating. The second die 412 includes a second planar surface 415 that has a first bond pad 416 and a second bond pad 478. The first bond pad 416 is coupled to the first lead 408 via a first bond wire 472. The second bond pad 478 is coupled to the second lead 474 via a second bond wire 476. In general, the first planar surface 413 defines an x-y plane that is substantially parallel to a surface of the substrate 402. Further the first planar surface 413 and the second planar surface 415 are substantially planar to one another.

The second die 432 is fixed to the second planar surface 415 of the first die 412 via a second electrically insulating adhesive layer 460. The second die 432 is rotated relative to the first die 412. A corner of the second die 432 is generally indicated at 435. The second die 432 includes a third bond pad 438 that is coupled to the first lead 408 via a third bond wire 470. The second die 432 also includes a fourth bond pad 480 that is coupled to another lead (not shown) of the substrate 402 via a fourth bond wire 482. In a particular embodiment, a third die 490 may be fixed to the second die 432. The third die 490 can be rotated relative to the second die 432 to provide horizontal and vertical access to the third and fourth bond pads 438 and 480. Additionally, other die may be stacked on the third die 490. Each of the second die 432, the third die 490, and the additional die may oriented and positioned according to an offset angle, a translational offset, or any combination thereof, relative to the immediately underlying die. The particular orientation and position of the die may be determined to place the particular die within a determined exclusion area associated with the underlying die. In a particular embodiment, the first and second electrically insulating adhesive layers 450 and 460 may be formed from a standard epoxy.

In a particular embodiment, the first die 412 may be a high voltage (HV) circuit, and the second die 432 can be a relatively low voltage (LV) circuit. In a particular example, the high voltage first die 412 can include a power regulator and other power supply circuitry. The low voltage second die 432 includes a microprocessor circuit that is interconnected with the high voltage first die 412 to receive a power supply and to control operation of the high voltage first die 412. In a particular example, the low voltage first die 432 is adapted to control a regulated power supply received from the high voltage first die 412.

In a particular embodiment, the multi-chip circuit device 400 includes the first die 412 coupled to a circuit substrate 402 and having a second substantially planar surface 415. The first die 412 includes electrical contacts 416 and 478 distributed on the second substantially planar surface 415 adjacent to at least three edges of the first die 412. The multi-chip circuit device 400 further includes the second die 432 attached to the second substantially planar surface 415 of the first die 412. The second die 432 is rotated by an offset angle about an axis relative to the first die 412. The offset angle is selected to allow horizontal and vertical access to the electrical contacts 416 and 474. In a particular example, the axis is the z-axis, which extends orthogonal to the substantially planar surface 415 of the first die 412.

In a particular embodiment, the offset angle is a non-integer multiple of 90 degrees. In a particular example, the multi-chip circuit package 400 includes a first die 412 coupled to the substrate 402, a second die 432 coupled to the first die 412 and offset (by an offset angle, by a translational offset, or any combination thereof) relative to the underlying first die 412, and a third die 490 coupled to the second die 432 and offset (by an offset angle, by a translational offset, or any combination thereof) relative to the underlying second die 432. In a particular example, the third die 490 is rotated by a second offset angle about the axis, where the second offset angle is selected to allow horizontal and vertical access to electrical contacts 438 and 480 of the second die 432.

In a particular example, the first die 412 and the second die 432 can be fixed to one another directly via the electrically insulating adhesive layer 460 while allowing vertical and horizontal access to the first and second bond pads 416 and 478 and without requiring a spacer or mounting structure to provide spacing for the bond wires. Thus, the vertical real estate consumed by the multi-chip circuit package 400 is less in a z-direction than a multi-chip circuit package that includes such mounting structures or spacers. Further, by stacking the first die 412 and the second die 432, the stacked first and second die 412 and 432 consume less real estate of the underlying substrate 402 that if the first and second die 412 and 432 were placed side by side on the substrate 402. Accordingly, the overall size of the multi-chip circuit package 400 is reduced.

Figure 5:
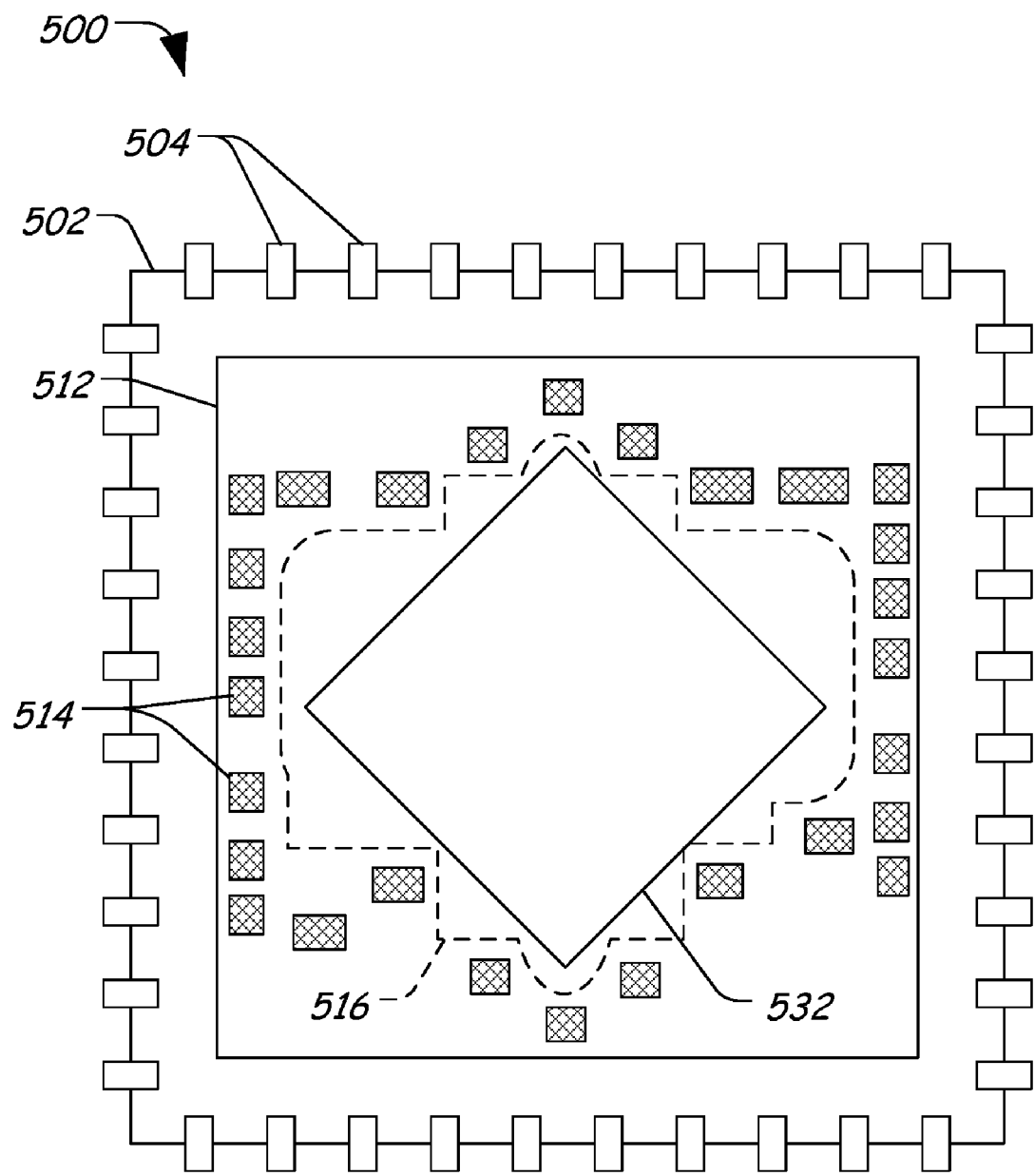
FIG. 5 is a diagram of a fourth particular illustrative embodiment of a multi-chip circuit package including a first die and a second die attached to the first die and rotated by an offset angle relative to the first die to fit within an exclusion area.

FIG. 5 is a diagram of a fourth particular illustrative embodiment of a multi-chip circuit package 500 including a first die 512 and a second die 532 attached to the first die 512 and rotated by an offset angle relative to the first die 512 to fit within an exclusion area 516. The multi-chip circuit package 500 includes a substrate 502 having a plurality of leads 504. The first die 512 includes a plurality of bond pads 514 positioned about a periphery of the first die 512. The second die 532 is rotated by an offset angle relative to the first die 512 to fit within the exclusion area 516.

In a particular example, the exclusion area 516 defines an area that does not include bond pads, such that the second die 532 can be placed onto the first die 512 within the exclusion area 516 without overlapping any of the plurality of bond pads 514. In this example, the exclusion area 516 defines an irregular shape that is circumscribed by the plurality of bond pads 514. In a particular embodiment, the arrangement of the plurality of bond pads 514 of the first die 512 defines the exclusion area 516 and the offset angle and x-y offset may be determined based on the size and shape of the second die 532 so that the second die 532 fits within the defined exclusion area 516.

Figure 6:
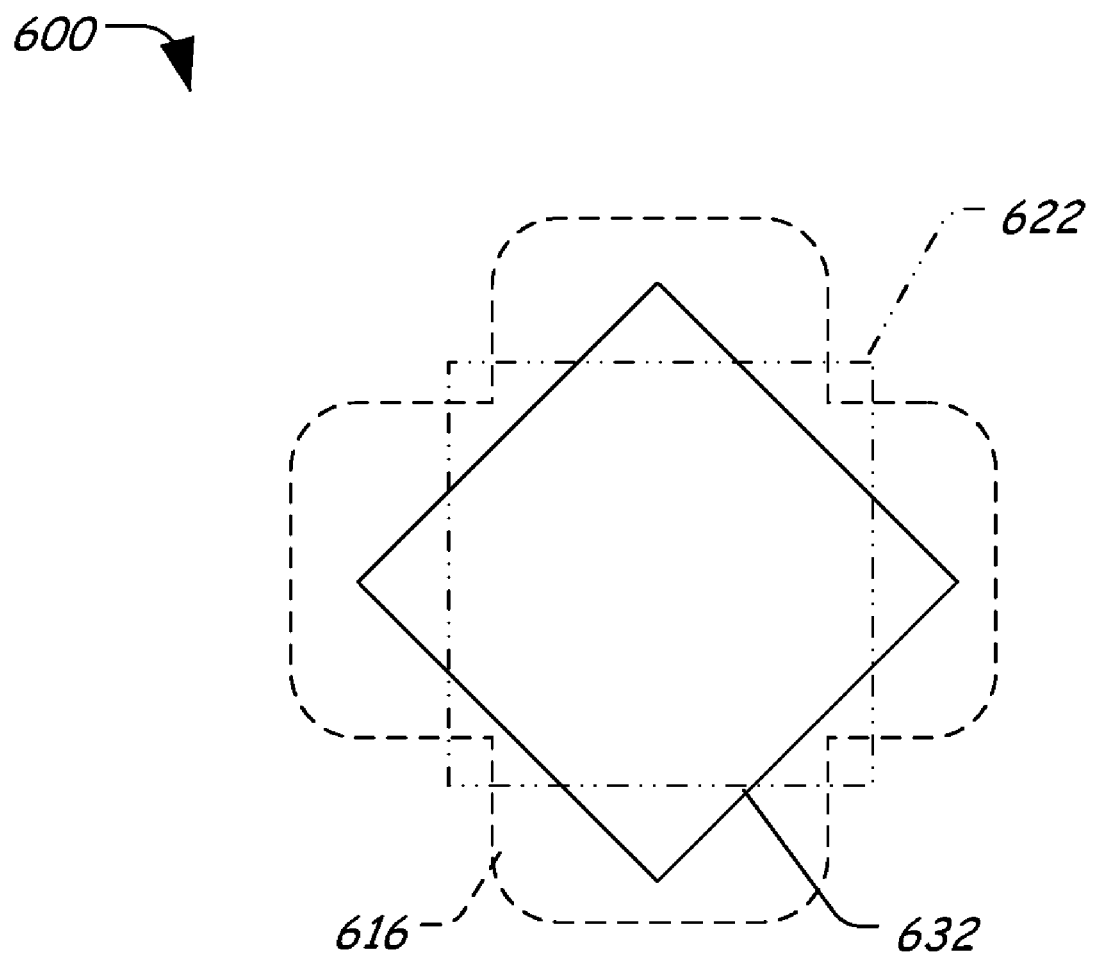
FIG. 6 is a diagram of a particular illustrative embodiment of a circuit device including a circuit die rotated by an offset angle to fit within an exclusion area.

FIG. 6 is a diagram of a particular illustrative embodiment of a circuit 600 including a circuit die 632 rotated by an offset angle to fit within an exclusion area 616. In this particular example, the exclusion area 616 has a substantially cross-shaped configuration, and the circuit die 632 is substantially square. By rotating the circuit die 632, the circuit die 632 can be positioned within the exclusion area 616. Without rotation, the circuit die 632 would overlap the exclusion area, as indicated by the phantom circuit die 622.

Figure 7:
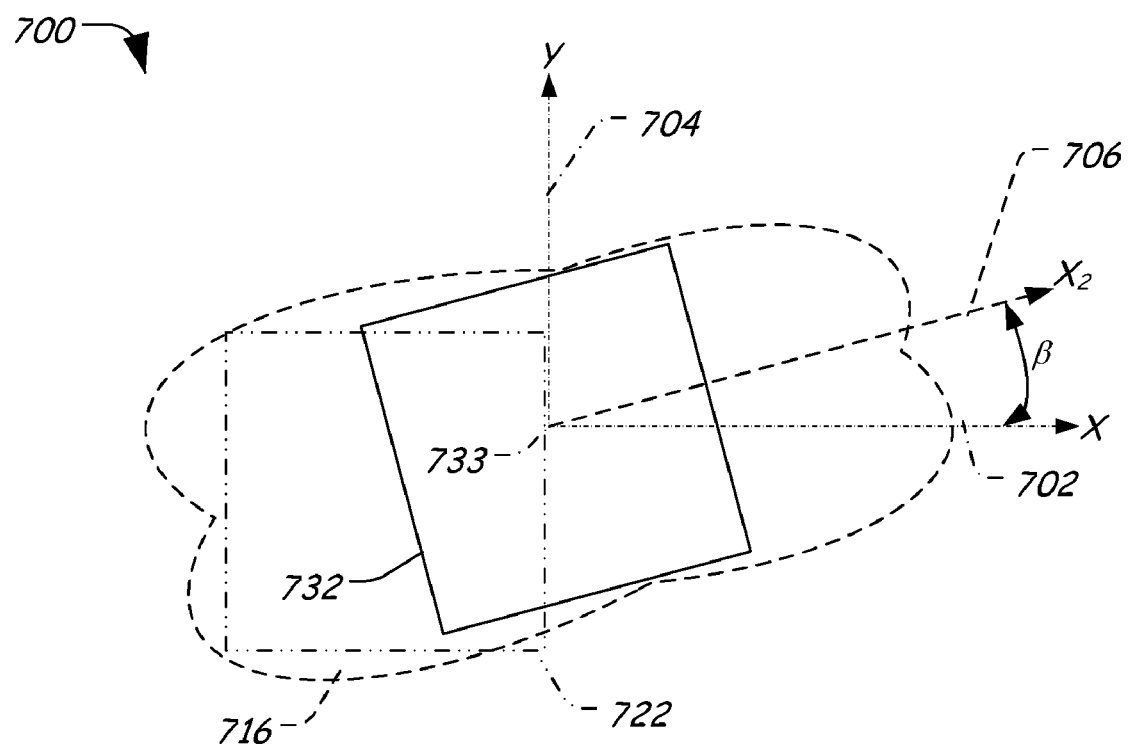
FIG. 7 is a diagram of a second particular illustrative embodiment of a circuit device including a circuit die rotated by an offset angle to fit within an exclusion area.

FIG. 7 is a diagram of a second particular illustrative embodiment of a circuit 700 including a circuit die 732 rotated by an offset angle ($\beta$) to fit within an exclusion area 716. In this particular example, the exclusion area 716 has an irregular shape. In general, the phantom circuit die 722 represents a non-rotated version of the circuit die 732. The phantom circuit die 722 cannot fit within the exclusion area 716, even if the phantom circuit die 722 is offset in x and y directions. However, by rotating the circuit die 732 about a central axis 733 within the x-y plane relative to the x-axis (X) 702 and the y-axis (Y) 704 by the offset angle ($\beta$), as indicated by the new x-axis ($X_2$) 706, the circuit die 732 fits within the exclusion area 716. In this particular example, the offset angle ($\beta$) is selected based on the exclusion area 716 and the size of the circuit die 732. In this particular example, the offset angle ($\beta$) is selected to be less than 45 degrees so that the circuit die 732 fits within the exclusion area 716.

Figure 8:
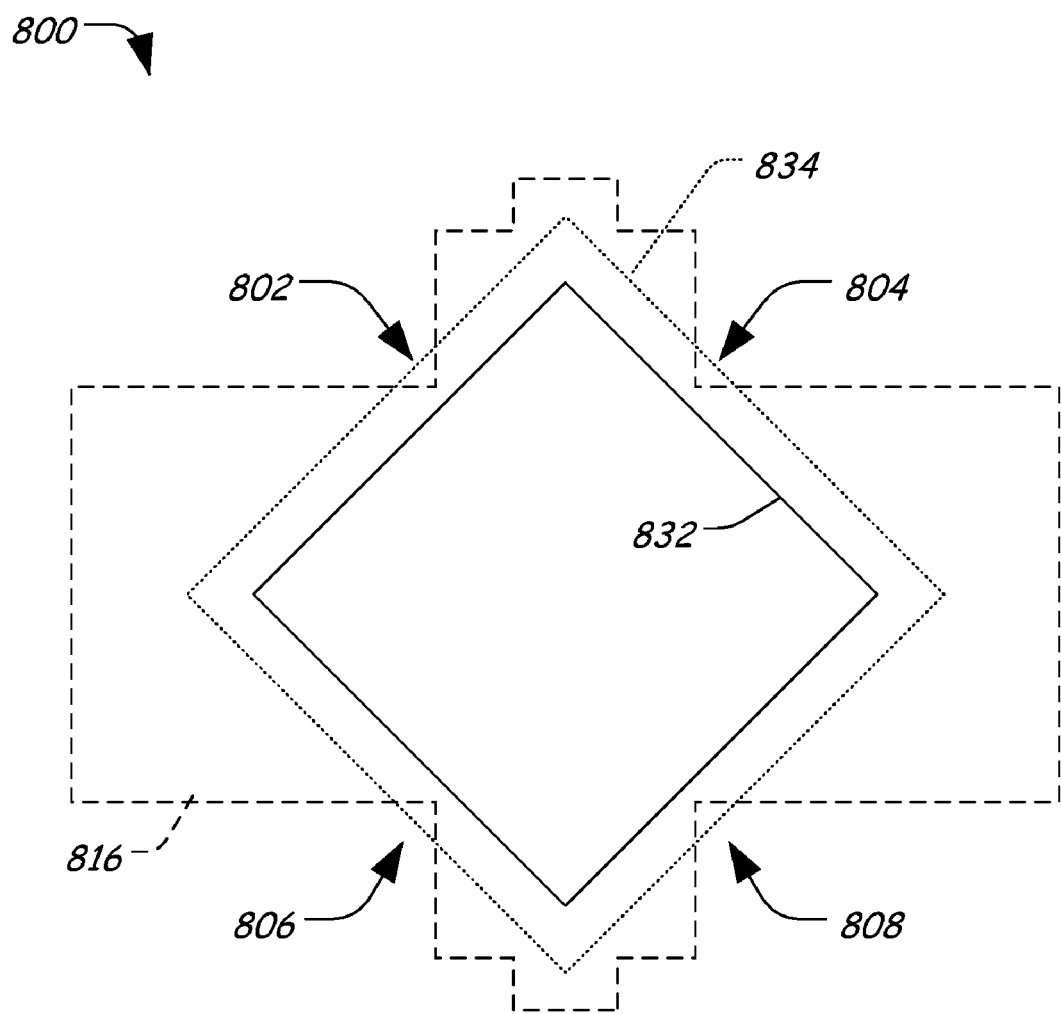
FIG. 8 is a diagram of a third particular illustrative embodiment of a circuit device including a circuit die rotated by an offset angle to fit within an exclusion area.

FIG. 8 is a diagram of a third particular illustrative embodiment of a circuit 800 including a circuit die 832 rotated by an offset angle to fit within an exclusion area 816. The exclusion area 816 has an irregular shape, and the circuit die 832 is rotated to fit within the exclusion area 816.

In a particular example, a different sized circuit die 834 can be selected that slightly overlaps the exclusion area 816. For example, in certain instances, the exclusion area 816 may be determined using software that is capable of defining the exclusion area 816 using only 90-degree angles, while there is no bond pad on the underlying circuit die at the corner locations 802, 804, 806, and 808. In this instance, the larger circuit die 834 can be used without obscuring the underlying bond pads, though the exclusion area 816 suggests otherwise.

In general, the exclusion area, such as the exclusion area 816, is defined by the positions of the one or more bond pads on the underlying circuit die. Depending on the particular circuit die, the exclusion area 816 may define any shape. Further, depending on the shape and size of the exclusion area 816, a second die may be rotated by an offset angle, shifted (translated) by offset distance, or any combination thereof to fit within the exclusion area. Subsequently, bond pads associated with the particular circuit die and with the second die may be electrically connected via bond wires to leads of an underlying substrate. The bond wires may be interleaved without violating device fabrication rules.

Figure 9:
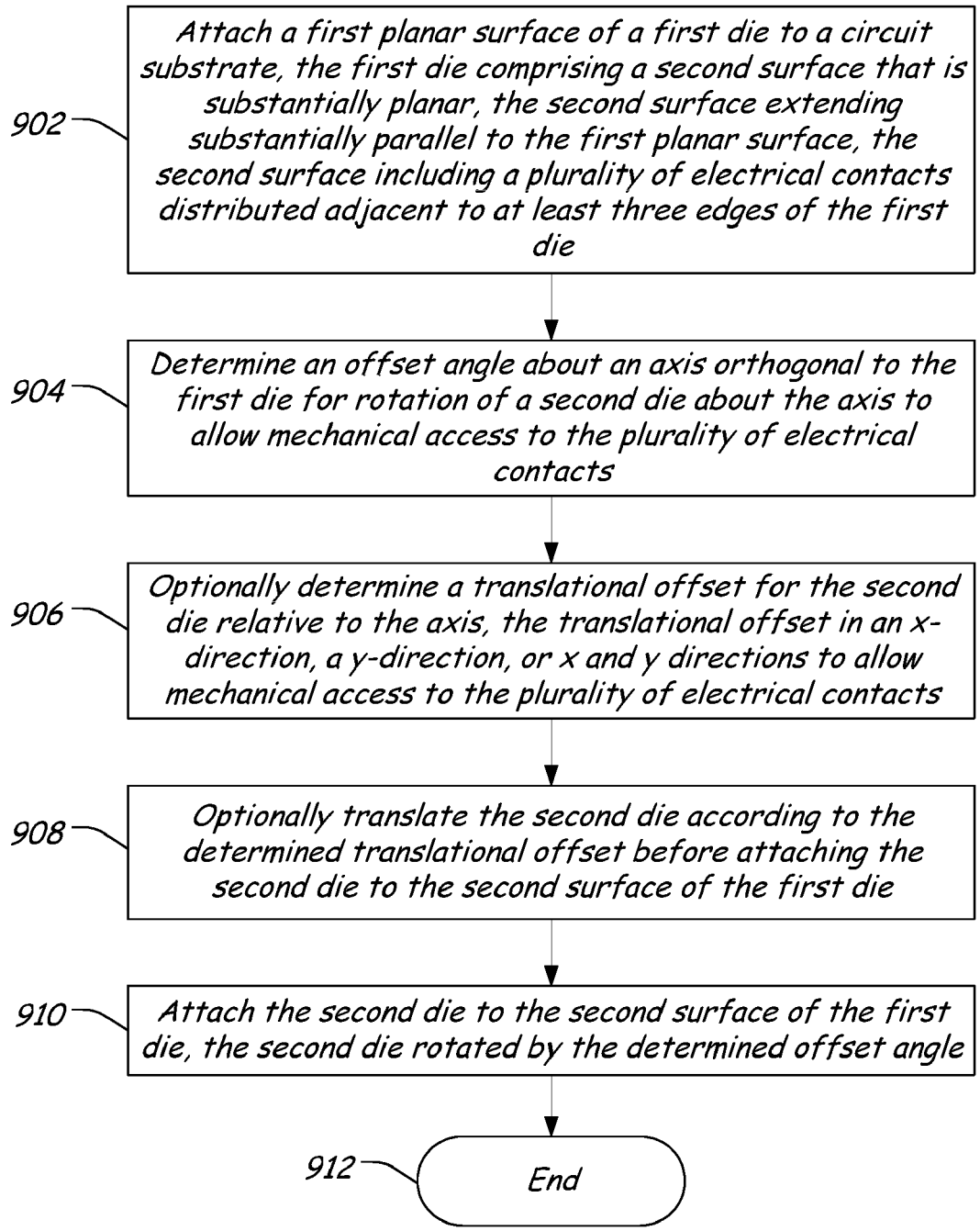
FIG. 9 is a flow diagram of a particular illustrative embodiment of a method of forming a multi-chip circuit package.

FIG. 9 is a flow diagram of a particular illustrative embodiment of a method of forming a multi-chip circuit package. At 902, a first planar surface of a first die is attached to a circuit substrate. The first die includes a second surface that is substantially planar and that extends substantially parallel to the first planar surface. The second surface includes a plurality of electrical contacts distributed adjacent to at least three edges of the first die. Advancing to 904, an offset angle about an axis orthogonal to the first die is determined for rotation of a second die about the axis to allow mechanical access to the plurality of electrical contacts. In a particular embodiment, the offset angle represents an angle of rotation of the second die relative to the first die that is a non-integer multiple of 90 degrees.

Continuing to 906, a translational offset is optionally determined for the second die relative to the axis. The translational offset represents an offset in an x-direction, a y-direction, or x and y directions to allow mechanical access to the plurality of electrical contacts. Moving to 908, the second die is optionally translated according to the determined translational offset before attaching the second die to the second surface of the first die. Continuing to 910, the second die is attached to the second surface of the first die, where the second die is rotated by the determined offset angle. The method terminates at 912.

In a particular embodiment, the method further includes attaching first bond wires from the plurality of electrical contacts to a respective plurality of conductive leads of the circuit substrate and attaching second bond wires from a second plurality of leads of the second die to a respective second plurality of conductive leads of the circuit substrate. The first bond wires and the second bond wires are interleaved without violating fabrication rules.

In general, while the rotational offset has been illustrated with respect to offset angles that are less than 90 degrees, it should be understood that the offset angle may be any angle that is a non-integer multiple of 90 degrees. Accordingly, the offset angle can be between 0 and 90 degrees, between 90 and 180 degrees, between 180 and 270 degrees, or between 270 and 360 degrees. Further, though the translational offsets in the x-direction and the y-direction have been shown to be in the negative x and the positive y directions, it should be understood that the translational offsets can be made in a negative x-direction or a positive x-direction and can be made in a negative y-direction or a positive y-direction. In a particular example, the offset angle and the translational offsets may be determined based on a size of the circuit die and the size of the exclusion area.

Although the present invention has been described with reference to preferred embodiments, workers skilled in the art will recognize that changes may be made in form and detail without departing from the spirit and scope of the invention.

What is claimed is:

1. A circuit device comprising:
  a first die coupled to a circuit substrate and having a substantially planar surface, the first die including electrical contacts distributed on the substantially planar surface adjacent to at least three edges of the first die; and
  a second die attached to the substantially planar surface of the first die, the second die rotated by an offset angle about an axis relative to a center the first die and offset from the axis by a translational offset, the offset angle and the translational offset selected to allow horizontal and vertical access to the electrical contacts.

2. The circuit device of claim 1, wherein the axis is orthogonal to the substantially planar surface of the first die.

3. The circuit device of claim 1, wherein the offset angle comprises a non-integer multiple of 90 degrees; and
  wherein the translational offset and the offset angle are selected to fit the second die within an exclusion area of the first die.

4. The circuit device of claim 1, further comprising a third die attached to a substantially planar surface of the second die, the third die rotated by a second offset angle about the axis, the second offset angle selected to allow horizontal and vertical access to electrical contacts of the second die.

5. The circuit device of claim 1, further comprising first bond wires to couple the electrical contacts of the first die to a base substrate.

6. The circuit device of claim 5, further comprising second bond wires to couple electrical contacts of the second die to the base substrate, the second bond wires interleaved with the first bond wires.

7. The circuit device of claim 1, wherein the first die comprises a high voltage circuit and wherein the second die comprises a microprocessor circuit.

8. The circuit device of claim 1, wherein the first die is physically larger than the second die.

9. A circuit device comprising:
  a first die coupled to a circuit substrate and having a substantially planar surface, the first die including electrical contacts distributed on the substantially planar surface;
  a second die attached to the substantially planar surface of the first die, the second die rotated about an axis by an offset angle relative to the first die to allow access to the first electrical contacts, the offset angle comprising a non-integer multiple of $\pi/4$ radians.

10. The circuit device of claim 9, wherein the electrical contacts are distributed on the substantially planar surface adjacent to at least three edges of the first die.

11. The circuit device of claim 9, further comprising a circuit substrate coupled to the first die, the circuit substrate comprising a plurality of electrically conductive leads.

12. The circuit device of claim 11, wherein the second die comprises second electrical contacts.

13. The circuit device of claim 12, further comprising:
  a first plurality of bond wires to couple the electrical leads of the first die to a respective plurality of electrically conductive leads of the circuit substrate; and
  a second plurality of bond wires interleaved with the first plurality of bond wires to couple the second electrical leads of the second die to a second respective plurality of electrically conductive leads of the circuit substrate.

14. The circuit device of claim 9, wherein the first die and the second die are attached by a standard epoxy.

15. The circuit device of claim 9, wherein the axis is a central axis of the first die, and wherein the second die is translated relative to the axis of the first die in an x-direction, in a y-direction, or in both x and y directions.

16. A method of forming a multi-chip circuit package, the method comprising:

attaching a first planar surface of a first die to a circuit substrate, the first die comprising a second surface that is substantially planar, the second surface extending substantially parallel to the first planar surface, the second surface including a plurality of electrical contacts distributed adjacent to at least three edges of the first die;

determining an offset angle about an axis orthogonal to the first die for rotation of a second die about the axis and determining a translational offset for the second die relative to a center of the first die to allow mechanical access to the plurality of electrical contacts; and attaching the second die to the second surface of the first die, the second die rotated relative to the first die by the offset angle and offset from the center by the translational offset.

17. The method of claim 16, wherein the offset angle comprises an angle of rotation of the second die relative to the first die that is a non-integer multiple of 90 degrees.

18. The method of claim 16, wherein determining the translational offset for the second die comprises:

determining the translational offset in at least one of an x-direction and a y-direction to allow mechanical access to the plurality of electrical contacts; and translating the second die according to the translational offset before attaching the second die to the second surface of the first die.

19. The method of claim 16, further comprising:

attaching first bond wires from the plurality of electrical contacts to a respective plurality of conductive leads of the circuit substrate;

attaching second bond wires from a second plurality of leads of the second die to a respective second plurality of conductive leads of the circuit substrate;

wherein the first bond wires and the second bond wires are interleaved.

20. The circuit device of claim 9, wherein the offset angle is less than 45 degrees.

* * * * *